United States Patent [19]
Jin et al.

[11] Patent Number: 5,591,037
[45] Date of Patent: Jan. 7, 1997

[54] METHOD FOR INTERCONNECTING AN ELECTRONIC DEVICE USING A REMOVABLE SOLDER CARRYING MEDIUM

[75] Inventors: Sungho Jin, Millington; Mark T. McCormack, Summit, both of N.J.

[73] Assignee: Lucent Technologies Inc., Murray Hill, N.J.

[21] Appl. No.: 251,547

[22] Filed: May 31, 1994

[51] Int. Cl.⁶ .................................................. H01L 21/60
[52] U.S. Cl. ..................... 439/91; 228/56.3; 228/180.22; 228/246
[58] Field of Search ............................ 228/56.3, 180.22, 228/246, 256; 439/91, 591, 876; 174/88 R

[56] References Cited

U.S. PATENT DOCUMENTS

| | | | |
|---|---|---|---|
| 4,655,382 | 4/1987 | Wong et al. | 228/56.3 |
| 4,737,112 | 4/1988 | Jin et al. | 439/91 X |
| 4,820,376 | 4/1989 | Lambert et al. | 439/91 X |
| 4,902,857 | 2/1990 | Cranston et al. | 439/91 X |
| 5,323,947 | 6/1994 | Jusky et al. | 228/56.3 |

FOREIGN PATENT DOCUMENTS 306558  12/1990  Japan ........................................ 439/91

OTHER PUBLICATIONS

Manko *Soldering Handbook for Printed Circuits and Surface Mounting* Van Nostrand Reinhold, New York 1986 pp. 178–181, 198–205.

*Primary Examiner*—Kenneth J. Ramsey
*Attorney, Agent, or Firm*—Glen E. Books

[57] ABSTRACT

In accordance with the invention, an electronic device having one or more contact pads is adhered to an array of transferable solder particles on a removable carrier sheet. The carrier is removed, as by dissolving, leaving solder selectively adhered to the contact pads. In a preferred embodiment the solder-carrying medium is water soluble, and the solder particles comprise solder-coated magnetic particles. Application of a magnetic material while the medium is drying or curing, produces a regular array of solder-coated particles. Using this method, devices having smaller than conventional contact structures can be readily interconnected.

9 Claims, 3 Drawing Sheets

- A: PROVIDE ELECTRONIC DEVICE HAVING CONTACT PADS
- B: ADHERE CONTACT PADS TO ARRAY OF SOLDER PARTICLES ON REMOVEABLE MEDIUM
- C: REMOVE MEDIUM
- D: PLACE CONTACT PADS IN CONTACT WITH SURFACE TO BE CONNECTED (a)

(b)

METHOD FOR INTERCONNECTING AN ELECTRONIC DEVICE USING A REMOVABLE SOLDER CARRYING MEDIUM

FIELD OF THE INVENTION

This invention relates to methods for interconnecting electronic circuits and devices and, in particular, to such methods using an array of transferable solder particles disposed on a removable carrier sheet.

BACKGROUND OF THE INVENTION

Modern electronic products including computers, consumer electronics, telecommunication equipment and automotive electronics require circuit interconnection. While off-chip interconnection and packaging densities have somewhat improved over the years, progress has been far slower than for on-chip semiconductor devices, where the dramatic decrease in circuit feature size has increased IC circuit densities from 250 K to 64 MB in memory devices. The typical width of present-day circuit contact pads for solder interconnection is about 25 mils (625 μm) for printed circuit boards, and about 4 mils (100 μm) for silicon-on-silicon flip-chip devices. This enormous imbalance between the micron-level features of silicon devices and the hundreds-of-microns required for contact pads has forced inefficient device integration. A large area of device real estate is wasted on fan-outs to larger-area, soldering contact pads. This fan out also results in longer travel path for electrons and hence slower device speed than could be realized with a compact, high-density interconnection scheme.

Most circuit board interconnections between mating contact pads utilize solder materials, such as the eutectic lead-tin solder (37 Pb-63 Sn). The solder materials are melted and solidified either by wave soldering or by surface mounting techniques. These techniques are described in *Soldering Handbook for Printed Circuits and Surface Mounting*, by H. H. Manko, Van Nostrand Reinhold, N.Y., 1986. The surface mounting procedure is typically based on screen printing technology with the wet solder paste printed on each circuit pad of the substrate board to be solder interconnected. Alternatively, the solder may be deposited on each of the contact pads by physical or chemical vapor deposition or by electrochemical deposition, in combination with photolithography.

Two of the main technical barriers to the achievement of high or ultra-high-density interconnections using smaller contact pad size are i) the absence of an industrially-viable technique for screen printing the solder paste below about 6 mil line width resolution and ii) the difficulty and high cost of large-area photolithography below the resolution of about 2 mil. Accordingly, there is a need for a new high density interconnection technology which is not restricted by screen printing or lithography. The present invention discloses such a technology.

SUMMARY OF THE INVENTION

In accordance with the invention, an electronic device having one or more contact pads is adhered to an array of transferable solder particles on a removable carrier sheet. The carrier is removed, as by dissolving, leaving solder selectively adhered to the contact pads. In a preferred embodiment the solder-carrying medium is water soluble, and the solder particles comprise solder-coated magnetic particles. Application of a magnetic material while the medium is drying or curing, produces a regular array of solder-coated particles. Using this method, devices having smaller than conventional contact structures can be readily interconnected.

BRIEF DESCRIPTION OF THE DRAWINGS

The nature, advantages and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
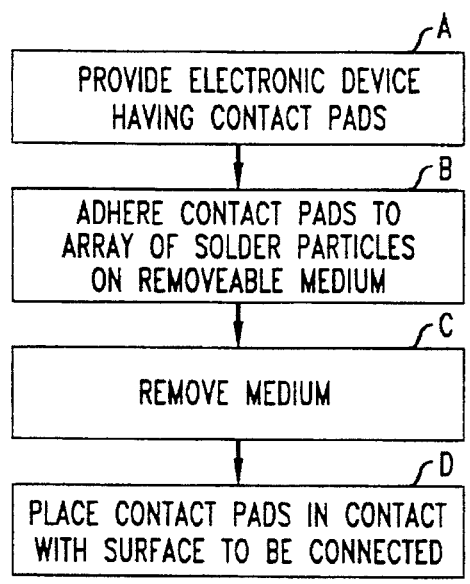
FIG. 1 is a block diagram showing the steps of making a high density connection.
Figure 2:
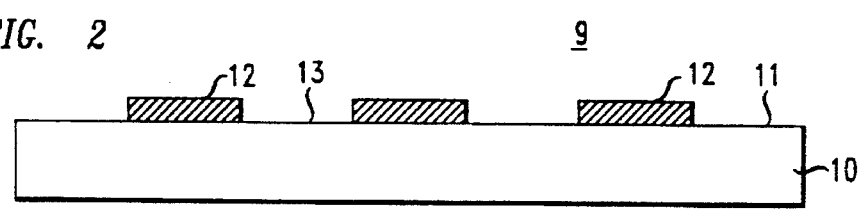
FIG. 2 illustrates a typical electronic device having conductive contact pads.

Referring to the drawings, FIG. 1 is a block diagram showing the steps in making a high density connection in accordance with the invention. The first step shown in block A is to provide an electronic device having one or more contact pads. As shown in FIG. 2 such an electronic device 9 typically comprises a substrate 10 having a substantially planar surface 11 and includes a plurality of conductive contact pads 12 rising above surface 11. The substrate 10 is typically a semiconductor wafer, an epoxy-based printed circuit board, or a ceramic substrate. Contact pads 12 are typically coated copper. The pads can be coated with various metallic or polymer finishes for corrosion resistance and to improve wetting of molten solder. Typical coatings are Au, Sn, solder and imidazole. The device can have numerous circuit elements (not shown) in the inter-pad areas 13.

Figure 3:
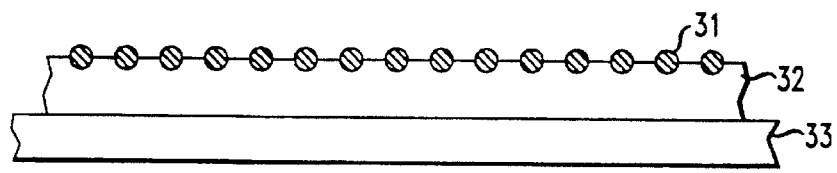
FIG. 3 is a schematic cross-section of a preferred solder carrying medium for use in the process of FIG. 1.
Figure 4:
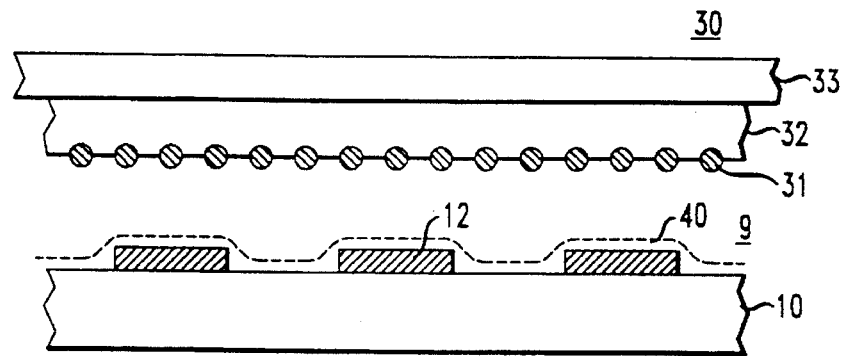
FIG. 4 shows the structure of FIG. 3 approaching contact with an electronic device.

The next step, shown in block B of FIG. 1, is to adhere the contact pads with an array of solder particles disposed on or in a removable carrier medium. This can be done by contacting the electronic device with the solder-carrying medium in the presence of heat. A preferred solder-carrying medium is shown in FIG. 3. In FIG. 4, the structure of FIG. 3 is shown approaching contact with the electronic device.

Turning first to FIG. 3, the solder-carrying medium 30 comprises an array of solder particles 31 at least partially embedded in a removable medium 32 with parts of the surfaces of the solder particles protruding beyond the surface of the medium for easy bonding. The medium 32 comprises a removable material such as solvent-soluble material. Exemplary removable materials are sheets of water-soluble material such as gelatine, starch or their combinations. These materials are particularly desirable as they are non-toxic to humans, low of cost, and slightly adhesive before fully dried. Other organic polymers such as polyvinyl alcohol, polyvinyl pyrrolidinone and polyacrylamide may be used. Exemplary solvent-soluble materials include polyvinyl acetate which is soluble in acetone, polyvinyl chloride (PVC) and acrylonitrile-butadiene-styrene (ABS) which are soluble in methyl ethyl ketone, and butylvinyl alcohol which is soluble in toluene. In order to minimize oxidation or decomposition of the medium, it is advantageous to carry out subsequent heating steps in an inert atmosphere such as nitrogen. Advantageously, the removable medium 32 can be lightly adhered to a support sheet 33 such as paper or a polymer film. Alternatively, a removable medium that can be volatilized or burned off, such as organic binders, can be used.

FIG. 4 shows the solder-carrying medium 30 approaching contact with an electronic device 9. The application of heat promotes adherence of the solder particles to the contact pads 12. The protrusion of the solder particles 31 beyond the surface of the carrier medium 32 allows easy contact and wetting of the solder to the metallic device pads 12. It desirable to have at least 5% of the height of each solder particle protruding, and preferably at least 20% of the height protruding. If desired, the mating surface 11 of electronic device 9 can be coated with an appropriate flux 40. The device 9 can be pre-heated, and then the solder-containing medium 30 can be placed over it. Vertical or sweeping pressure (as by weight or roller) can then be applied to either tack or melt the solder particles onto the contact pads. Alternatively, the solder medium can be heated together with the substrate under applied weight. The desired temperature to achieve the tacking is preferably above room temperature but below the melting temperature of the solder. The required temperature for satisfactory tacking depends on the applied pressure and the flux used, and the optimum combination of processing can be easily determined empirically.

The dimensions of the solder particles and contact pads are chosen such that only those solder particles facing the contact pads are tacked or melted, while the particles in the inter-pad areas 13 are not tacked or melted onto the inter-pad region. The surfaces of the inter-pad areas 13 is typically covered with non-metallic insulating materials such as polymer, and hence the solder is not easily tacked or melted onto them.

The third step in interconnecting shown in block C of FIG. 1 is to remove the carrier medium leaving solder selectively on the contact pads. This step is accomplished by dissolving the material with an appropriate solvent. (If a support sheet 33 is used, it can be peeled away before dissolving the removable material). The solder particles tacked or melted to the contact pads will remain on the pads, and the untacked solder particles on the inter-pad regions 13 can be washed away by water or other solvent.

Figure 5:
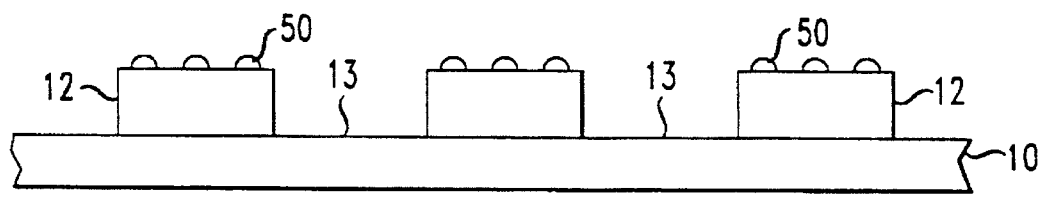
FIG. 5 shows the electronic device after the carrier medium and the untacked solder particles have been removed.

FIG. 5 illustrates the device of FIG. 2 after the carrier medium and the untacked solder particles have been removed. The adhered solder particles 50 remain on the contact pads 12. Alternatively, if the solder particles 50 have been raised to a temperature above their melting point, they will appear as a thin solder layer (not shown) on the surface of the contact pads.

If the solder particles have not been previously melted, they can advantageously be melted after the removal of the carrier medium. The contact angle of the molten solder during the wetting of the contact pad can be controlled by the choice of solder and the surface finish of the pad. If a subdivided solder is desired, then the merging of tacked solder particles can be minimized by using high surface tension solder such as a Zn-containing solder, Sn—In—Zn or Sn—Ag—Zn alloy on a Cu finish. If subdivision is not needed, a pretinned surface or an Au-coated surface can be used to reduce the contact angle. Alternatively Pb—Sn based solders of low contact angle can be used. The temperature of the solder is deskably raised to above the melting point, for example, ~183° C. for 63 Sn-37 Pb eutectic solder, 139° C. for 57 Bi-43 Sn, 120° C. for 49 Sn-51 In, and 221° C. for 96.5 Sn-3.5 Ag. Any solder particles located in the inter-pad regions 13, even though melted, do not easily wet the nonmetallic or polymeric intra-pad surface. Only the contact pads are coated with the solder.

Figure 6:
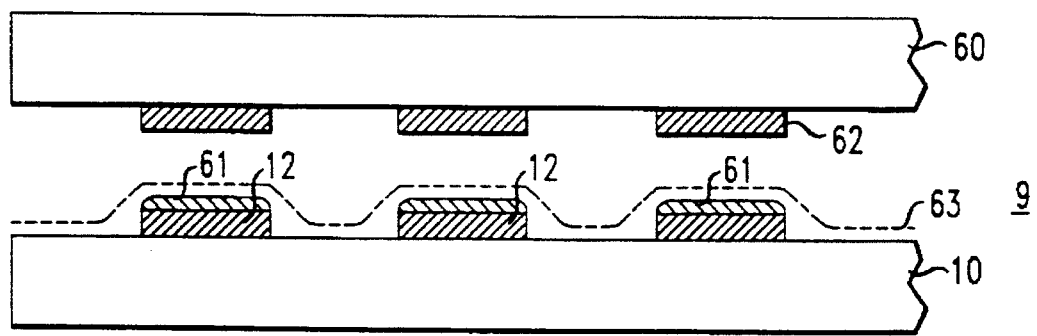
FIG. 6 shows the solder-containing pads of the electronic device approaching contact with the device to be connected to the pads.

The next step in the interconnection process shown in FIG. 1, Block D is to place the solder-containing contact pads of the device of FIG. 5 in contact with the surfaces to be connected. This is preferably accomplished, as shown in FIG. 6, in a subsequent reflow interconnection operation by bringing down the mating device 60, onto the device 9 with the solder melted in layers 61. The mating device is typically an electronic device having corresponding mating contact pads 62 to device 9. If desired, the mating surface 11 of device 9 can be coated with an appropriate flux 63. The melting can be accomplished by a number of known heating methods, e.g., oven heating, infrared heating, etc. The thickness of the solder layer in FIG. 6 can be increased, if desired, by repeating the first three steps of FIG. 1 using fresh solder-carrying medium as many times as is needed in order to achieve proper solder joint size and geometry before the final reflow operation.

The solder-carrying medium of FIG. 3 is conveniently fabricated in any of at least three different ways. One method is to dissolve the matrix material in water or solvent (with optionally added particulate or soluble materials for viscosity control), to sheet out the materials as a thin layer of desired thickness, e.g., by spin coating, doctor blading, spray coating, rolling, etc., and then to sprinkle the solder particles on top of the liquid or semi-liquid layer. Part of the matrix solution may be pre-dried in order to ensure that the solder particles protrude as shown in FIG. 3. A second method is to premix a composite solution containing both the solder particles and the dissolved medium, and sheet out the composite into a thin layer. The thickness of the sheeted layer is adjusted so that after the solution is dried and the volume is decreased, the final thickness of the matrix material is less than the solder particle diameter in order to have solder protrusion. The soldering flux to be used for reflow interconnection may contain some of the same solvent to remove, prior to or during the soldering operation, any residual coating of the matrix material on the solder surface. A third method is to tack solder particles to the medium by utilizing the stickiness of the soluble medium either before it is fully dried or by partially wetting the very top surface with water or solvent. The tacky surface can then be pressed against an array of solder particles to pick them up.

The solder-containing medium may also have optional additional support layer material 33 to strengthen the medium for easily handling, e.g., winding onto or unwinding from a spool. This support layer could be a polymer or plastic tape (e.g. polyethylene), paper or other sheet-form materials with optionally slightly tacky surface so that it adheres to the back of the solder-containing sheet but can be peeled away if needed. Alternatively, the solder-containing medium can be directly fabricated using the support layer as a substrate.

The desirable solder particle shape is spherical as it is easy to reproducibly manufacture, relatively uniform size and shape, and provides particles which will protrude from the medium with uniformity. Desired size range of the solder particles is 0.2–200 µm, and preferably 0.5–50 µm. Fluxes such as RMA (Rosin-Mildly-Activated) may be used, e.g., by spray coating on either the solder-carrying medium or on the substrate, to improve the wetting of the solder onto the contact pad metal surface.

In order to minimize undesirable electrical shorting between adjacent contact pads, e.g., caused by statistically possible percolation of particles (stringer formation), the area fraction covered by solder particles in the solder-containing medium is preferably restricted to less than 60% coverage and more preferably, less than 40% coverage.

Figure 7:
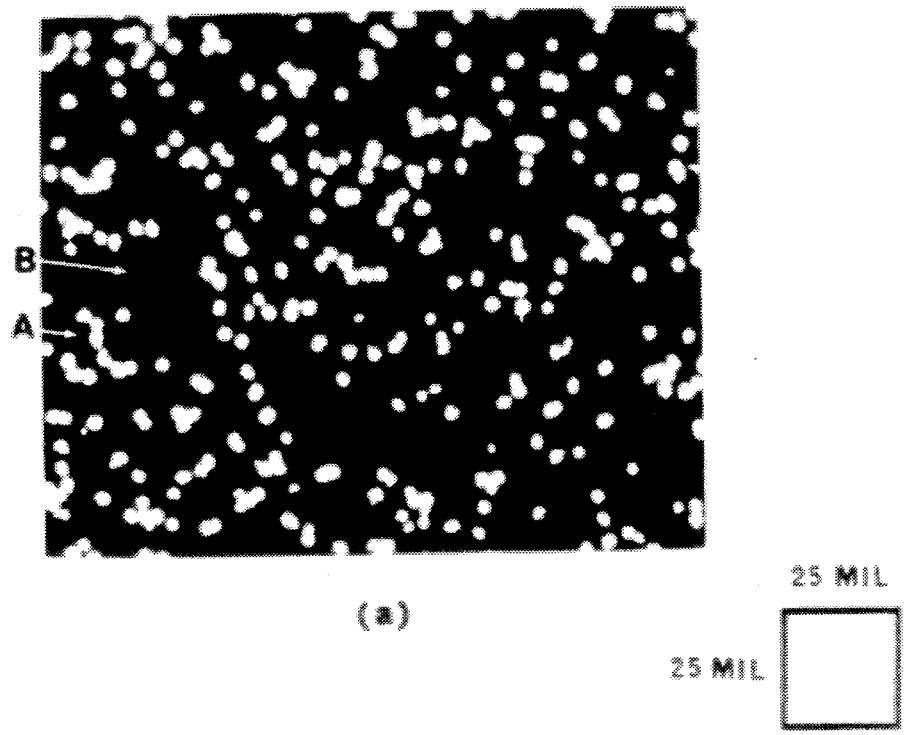
FIGS. 7 and 8 are photomicrographs showing solder particle dispersion in the absence of magnetic separation and with magnetic separation, respectively.
Figure 8:
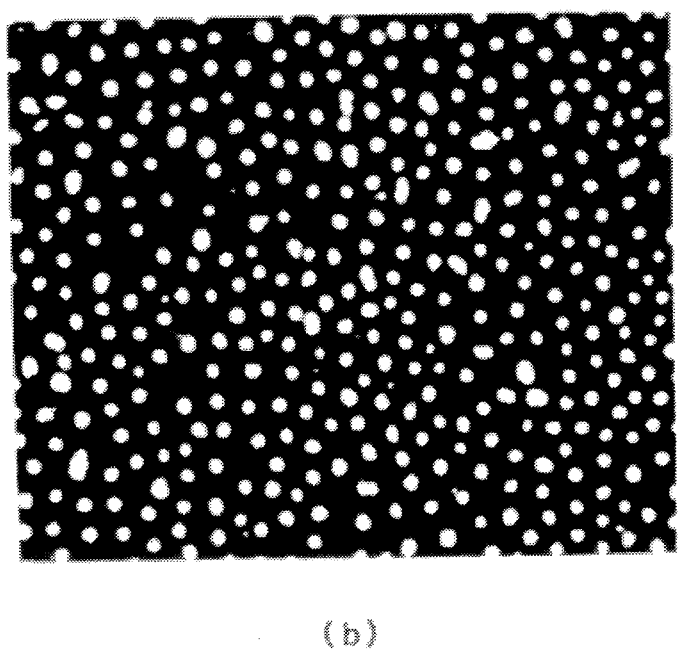

A novel way of reducing the probability of the shorting (and variation in solder amount) is to use magnetic separation. The solder particles can contain magnetic cores, e.g. they can be made by electroless coating of ferromagnetic particles with solder. For example, if 5 µm thick layer of solder is coated on the surface of 7 µm diameter iron particles, the solder to iron volume fraction ratio would be about 4:1. In the presence of a vertical magnetic field properly balanced against the surface tension of the matrix polymer, magnetic particles in a viscous medium repel each other and separate as demonstrated in U.S. Pat. No. 4,737,112 to Jin et al issued on Apr. 12, 1988, which is incorporated herein by reference. As shown in comparative micrographs of FIGS. 7 and 8, the presence of vertical magnetic field achieves a regular dispersion of particles with little stringer formation. FIG. 7 shows random dispersion in the absence of magnetic separation and FIG. 8 shows the regular dispersion obtained by magnetic separation. The structure shown in FIG. 3, can be desirably fabricated by the magnetic separation method and then dried to produce a washable solder-carrying medium that can accommodate more solder particles with a reduced risk of inter-pad shorting or significant pad-to-pad variation in solder particle density.

The magnetic core can be any one of a number of ferromagnetic materials: relatively soft magnetic materials such as Fe, Ni, Co, Ni—Fe (permalloy), Ni-Zn ferrite, Mn-Zn ferrite, or permanent magnetic materials such as Fe—Al—Ni—Co (Alnico), Fe—Cr—Co, hexaferrites, rare-earth cobalt or Nd—Fe—B type magnets. The soft magnetic materials are easy to magnetize and hence are preferred. The metallurgical reaction between the solder material and the magnetic core material should be minimized so it does not inadvertently deteriorate the solder properties.

The inventive solder-carrying medium is also suitable for area-array interconnections as well as multi-layered three dimensional interconnection for high circuit density. The limitations in linewidth resolution encountered in a conventional solder-paste screen printing technique or large-area lithographic patterning of deposited solder are not present in the new interconnection methodology using the inventive transferable-solder medium. Fine-line, high-density contact pads can be easily and inexpensively coated using the inventive medium and method.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

We claim:

1. A method for connecting an electronic device having one or more electrical contact pads to a second device comprising the steps of:

providing said electronic device having one or more contact pads;

contacting said device with an array of solder-coated magnetic particles disposed on a removable carrier sheet;

selectively adhering solder from said array to said contact pads;

removing said flexible carrier medium while leaving solder on said contact pads; and placing the solder carrying pads in contact with said second device.

2. The method of claim 1 wherein said particles are adhered to said contact pads by applying heat to said particles.

3. The method of claim 1 wherein said removable carrier sheet comprises soluble material and is removed by dissolving in a solvent.

4. The method of claim 1 wherein said removable carrier sheet comprises a water soluble material.

5. A solder-carrying carrier sheet for applying solder to the surface of electrical contact pads comprising:

a layer of soluble carrier medium; and an array of solder-coated magnetic particles at least partially embedded in said soluble medium, said particles protruding from the surface of said medium.

6. A solder-carrying sheet according to claim 5 wherein said soluble carrier medium is water soluble.

7. A solder-carrying sheet according to claim 5 further comprising a support layer adhered to said layer of soluble carrier medium.

8. An electronic device having one or more electrical contact pads connected to a second device by the process of claim 1 or 2 or 3 or 4.

9. A method for connecting an electronic device having one or more electrical contact pads to a second device comprising the steps of:

forming a layer of removable material;

sprinkling particles comprising solder onto said layer;

providing said electronic device;

contacting said device with said particles disposed on said layer;

selectively adhering particles from said layer onto said contact pads;

removing said removable material while leaving said particles on said contact pads; and placing said pads in contact with said second device.

* * * * *